US009838821B2

(12) United States Patent
Kelloniemi

(10) Patent No.: US 9,838,821 B2
(45) Date of Patent: Dec. 5, 2017

(54) METHOD, APPARATUS, COMPUTER PROGRAM CODE AND STORAGE MEDIUM FOR PROCESSING AUDIO SIGNALS

(71) Applicant: Nokia Technologies Oy, Espoo (FI)

(72) Inventor: Antti Kelloniemi, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/564,043

(22) Filed: Dec. 8, 2014

(65) Prior Publication Data

US 2015/0189436 A1 Jul. 2, 2015

(30) Foreign Application Priority Data

Dec. 27, 2013 (GB) .................................. 1323038.8

(51) Int. Cl.
*H03G 5/00* (2006.01)
*H04S 7/00* (2006.01)

(52) U.S. Cl.
CPC ............ *H04S 7/30* (2013.01); *H04R 2499/11* (2013.01); *H04S 2400/13* (2013.01); *H04S 2400/15* (2013.01); *H04S 2420/07* (2013.01)

(58) Field of Classification Search
CPC .... H04S 7/30; H04S 2400/13; H04S 2400/15; H04S 2420/07; H04R 2499/11
See application file for complete search history.

(56) References Cited

U.S. PATENT DOCUMENTS 7,171,008 B2 1/2007 Elko
8,180,062 B2 5/2012 Turku et al.
2007/0100605 A1* 5/2007 Renevey ............. G10L 21/0272 704/201
2010/0110232 A1 5/2010 Zhang et al.
2010/0169103 A1 7/2010 Pulkki
2011/0286609 A1* 11/2011 Faller ..................... H04R 3/005 381/92

(Continued)

FOREIGN PATENT DOCUMENTS

EP 1509065 A1 2/2005
EP 2346028 A1 7/2011

(Continued)

OTHER PUBLICATIONS

Pulkki et al., "Directional audio coding—perception-based reproduction of spatial sound", International Workshop on the Principles and Applications of Spatial Hearing, Nov. 11-13, 2009, 4 pages.

(Continued)

*Primary Examiner* — Andrew L Sniezek
(74) *Attorney, Agent, or Firm* — Alston & Bird LLP

(57) ABSTRACT

An apparatus receives a first audio signal captured by a first microphone of a device and at least a second audio signal captured by at least a second microphone of the device. The apparatus estimates a diffuseness of sound based on the received first and at least second audio signals. The apparatus may then form at least one final audio signal based on at least one of the received first audio signal and the received at least second audio signal by adjusting an audibility of diffuse sound for the final audio signal in response to the estimated diffuseness, in order to enable an enhanced perception of sound with respect to at least one criterion with the at least one final audio signal.

20 Claims, 8 Drawing Sheets

(56) References Cited

U.S. PATENT DOCUMENTS

| | | | | |
|---|---|---|---|---|
| 2011/0299702 | A1* | 12/2011 | Faller | G10L 19/008 381/92 |
| 2012/0114126 | A1* | 5/2012 | Thiergart | G10L 21/0272 381/17 |
| 2012/0243695 | A1 | 9/2012 | Sohn et al. | |
| 2013/0016842 | A1* | 1/2013 | Schultz-Amling | G10L 19/173 381/17 |
| 2013/0051570 | A1 | 2/2013 | Unno et al. | |
| 2013/0142342 | A1 | 6/2013 | Del Galdo et al. | |
| 2013/0317830 | A1* | 11/2013 | Visser | G10L 19/00 704/500 |
| 2015/0286459 | A1* | 10/2015 | Habets | G10K 11/346 700/94 |
| 2016/0293179 | A1* | 10/2016 | Thiergart | H04R 3/005 |

FOREIGN PATENT DOCUMENTS

| | | | |
|---|---|---|---|
| EP | 2437517 | A1 | 4/2012 |
| EP | 2738762 | A1 | 6/2014 |
| JP | 2008-131183 | A | 6/2008 |

OTHER PUBLICATIONS

"Directional audio coding", TKK Acoustics Laboratory, Retrieved on Jan. 15, 2015, Webpage available at : http://legacy.spa.aalto.fi/research/cat/DirAC/.

"Coherence (signal processing)", Wikipedia, Retrieved on Jan. 15, 2015, Webpage available at : http://en.wikipedia.org/wiki/Coherence_(signal_processing).

"Convolution", Wikipedia, Retrieved on Jan. 15, 2015, Webpage available at : http://en.wikipedia.org/wiki/Convolution.

"Cross-correlation", Wikipedia, Retrieved on Jan. 15, 2015, Webpage available at : http://en.wikipedia.org/wiki/Cross-correlation.

Search Report received for corresponding United Kingdom Patent Application No. 1323038.8, dated Aug. 4, 2014, 4 pages.

Thiergart et al., "Parameter Estimation in Directional Audio Coding Using Linear Microphone Arrays", 130th Audio Engineering Society Convention, vol. 2, Paper No. 8434, May 13, 2011, pp. 1121-1129.

* cited by examiner

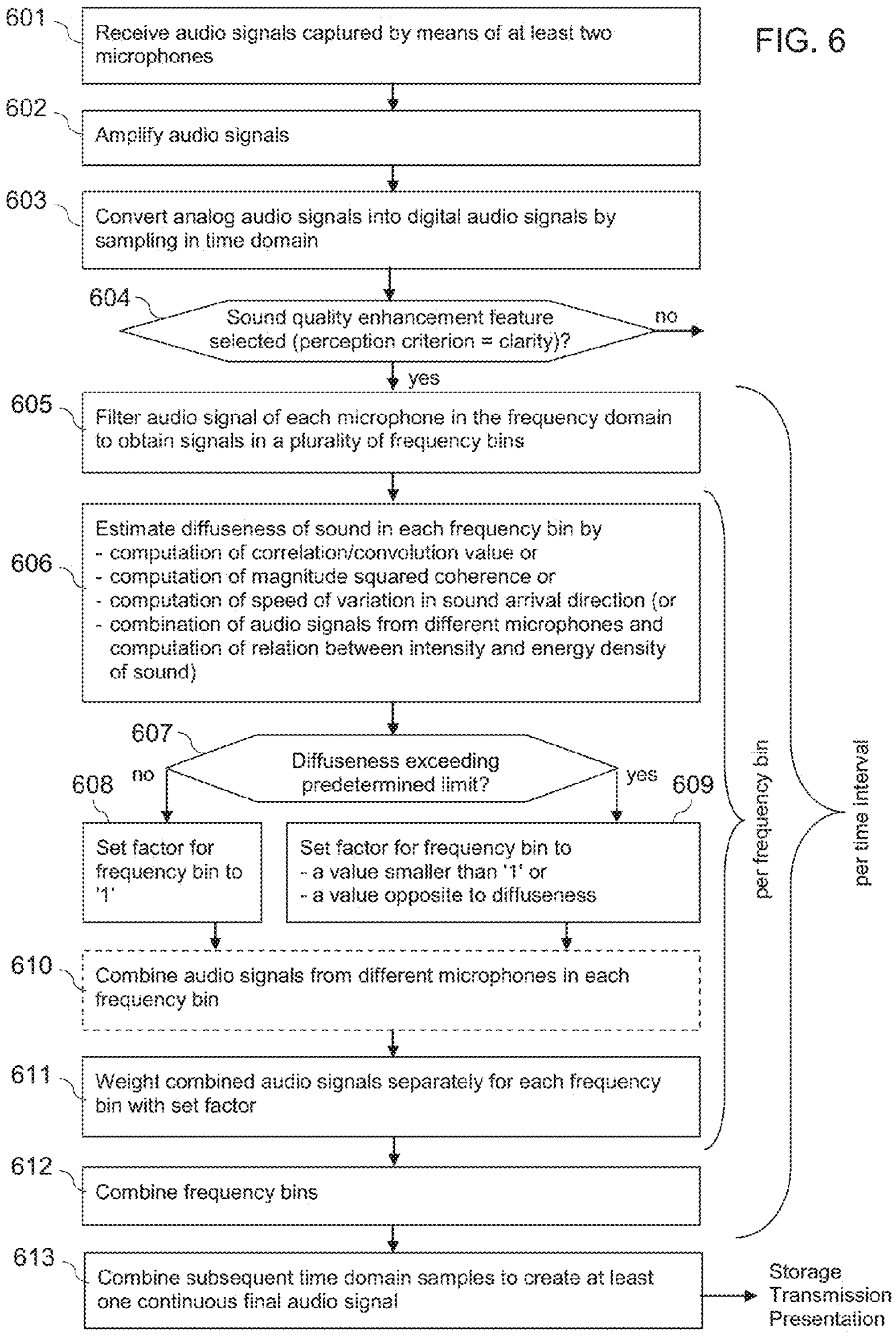
FIG. 6
601
Receive audio signals captured by means of at least two microphones
602
Amplify audio signals
603
Convert analog audio signals into digital audio signals by sampling in time domain
604
Sound quality enhancement feature selected (perception criterion = clarity)?
no
yes
605
Filter audio signal of each microphone in the frequency domain to obtain signals in a plurality of frequency bins
606
Estimate diffuseness of sound in each frequency bin by
- computation of correlation/convolution value or
- computation of magnitude squared coherence or
- computation of speed of variation in sound arrival direction (or
- combination of audio signals from different microphones and computation of relation between intensity and energy density of sound)
607
Diffuseness exceeding predetermined limit?
no
yes
608
Set factor for frequency bin to '1'
609
Set factor for frequency bin to
- a value smaller than '1' or
- a value opposite to diffuseness
610
Combine audio signals from different microphones in each frequency bin
611
Weight combined audio signals separately for each frequency bin with set factor
612
Combine frequency bins
613
Combine subsequent time domain samples to create at least one continuous final audio signal
Storage
Transmission
Presentation
per frequency bin
per time interval

METHOD, APPARATUS, COMPUTER PROGRAM CODE AND STORAGE MEDIUM FOR PROCESSING AUDIO SIGNALS

FIELD OF THE DISCLOSURE

The invention relates to the field of audio processing and more specifically to methods, apparatuses, computer program codes and storage mediums for processing audio signals that have been captured by multiple microphones.

BACKGROUND

Various known devices comprise a microphone to enable a capture of sound for different purposes. Devices comprising a microphone may be stationary or mobile.

A mobile phone, for example, may comprise a microphone for capturing speech of a user for use in telephone conversations, for supporting voice commands and for supporting voice recording. A video camera, for example, may comprise a microphone for capturing a video along with the associated sound.

Some devices, for instance some mobile phones, are moreover equipped with two or more microphones.

SUMMARY OF SOME EMBODIMENTS OF THE INVENTION

A method is presented as an example embodiment of the invention, which comprises receiving, by an apparatus, a first audio signal captured by a first microphone of a device and at least a second audio signal captured by at least a second microphone of the device. The method further comprises estimating, by the apparatus, a diffuseness of sound based on the received first and at least second audio signals. The method further comprises forming at least one final audio signal based on at least one of the received first audio signal and the received at least second audio signal by adjusting an audibility of diffuse sound for the final audio signal in response to the estimated diffuseness, in order to enable an enhanced perception of sound with respect to at least one criterion with the at least one final audio signal.

A first apparatus is presented as an example embodiment of the invention, which comprises means for realizing the actions of the presented method.

The means of this apparatus can be implemented in hardware and/or software. They may comprise for instance a processor for executing computer program code for realizing the required functions, a memory storing the program code, or both. Alternatively, they could comprise for instance circuitries that are configured to realize the required functions, for instance implemented in a chipset or a chip, like an integrated circuit. There may be separate means for realizing different actions or the same means for realizing all of the actions.

A second apparatus is presented as an example embodiment of the invention, which comprises at least one processor and at least one memory including computer program code, the at least one memory coupled to the at least one processor and the computer program code configured to, with the processor, cause the apparatus at least to perform the following: receive a first audio signal captured by a first microphone of a device and at least a second audio signal captured by at least a second microphone of the device; estimate a diffuseness of sound based on the received first and at least second audio signals; and form at least one final audio signal based on at least one of the received first audio signal and the received at least second audio signal by adjusting an audibility of diffuse sound for the final audio signal in response to the estimated diffuseness, in order to enable an enhanced perception of sound with respect to at least one criterion with the at least one final audio signal.

A non-transitory computer readable storage medium is presented as an example embodiment of the invention, in which computer program code is stored. The computer program code causes an apparatus to perform the actions of the presented method when executed by a processor.

The computer readable storage medium could be for example a disk or a memory or the like. The computer program code could be stored in the computer readable storage medium in the form of instructions encoding the computer-readable storage medium. The computer readable storage medium may be intended for taking part in the operation of a device, like an internal or external hard disk of a computer, or be intended for distribution of the program code, like an optical disc.

It is to be understood that also such a computer program code by itself has to be considered an example embodiment of the invention.

Any of the presented apparatuses may comprise only the indicated components or one or more additional components.

Any of the presented apparatuses may be a module or component for a device, for example a chip or a controller. Any of the presented apparatuses may be a part of the device comprising the first microphone and the at least second microphone. Alternatively, any of the presented apparatuses may be the device comprising the first microphone and the at least second microphone. Alternatively or in addition, any of the presented apparatuses may be one of a mobile device, a mobile computing device, a mobile phone, a smartphone, a tablet computer and a video camera.

In an example embodiment, the presented method is an information providing method, and the presented first apparatus is an information providing apparatus. In one embodiment, the means of the presented first apparatus are processing means.

In certain embodiments of the described methods, the methods are methods for processing audio signals. In certain embodiments of the described apparatuses, the apparatuses are apparatuses for processing audio signals.

It is to be understood that any feature presented in this document for a particular example embodiment may also be used in combination with any other described example embodiment of any category.

Further, it is to be understood that the presentation of the invention in this section is merely by way of example and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE FIGURES

FIG. 6 is a flow chart illustrating example operations at the device of FIG. 4;

DETAILED DESCRIPTION OF THE FIGURES

Figure 1:
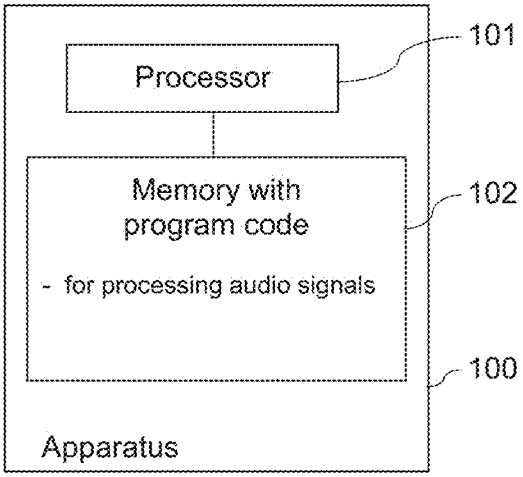
FIG. 1 is a schematic block diagram of an example apparatus.

FIG. 1 is a schematic block diagram of an example apparatus 100. Apparatus 100 comprises a processor 101 and, linked to processor 101, a memory 102. Memory 102 stores computer program code for processing audio signals. The processing could comprise for instance an adjustment of the audibility of diffuse sound in audio signals captured by at least two microphones of a single device. Processor 101 is configured to execute computer program code stored in memory 102 in order to cause an apparatus to perform desired actions. Apparatus 100 is an example embodiment of any apparatus according to the invention. Memory 102 is an example embodiment of a non-transitory computer readable storage medium, in which computer program code according to the invention is stored.

Apparatus 100 could be a mobile device, like a mobile phone, a smartphone, a tablet computer, a camera or some other mobile computing device, but it could also be a stationary device. Apparatus 100 could equally be a component, like a chip or circuitry on a chip for any kind of device. Optionally, apparatus 100 could comprise various other components, for instance microphones and/or a loudspeaker and/or a camera and/or a display and/or a user interface like a touchscreen and/or a data interface configured to enable an exchange of data with other apparatuses and/or a further memory and/or a further processor, etc.

An operation of an apparatus will now be described with reference to the flow chart of FIG. 2. The operation is an example embodiment of a method according to the invention. Processor 101 and the program code stored in memory 102 may cause an apparatus to perform the operation when the program code is retrieved from memory 102 and executed by processor 101. The apparatus that is caused to perform the operation can be apparatus 100 or some other apparatus, for example but not necessarily a device comprising apparatus 100.

The apparatus receives a first audio signal captured by a first microphone of a device and at least a second audio signal captured by at least a second microphone of the device. (action 201) It has to be noted that the apparatus caused to perform the actions can be or belong to the device comprising the plurality of microphones or another device. It is further to be understood that the received audio signals may be audio signals as output by the microphones, or audio signals that have already been processed in some way, for example amplified, filtered, converted into the digital domain, etc.

The apparatus furthermore estimates a diffuseness of sound based on the received first and at least second audio signals. (action 202) The diffuseness of sound—which could also be referred to as the degree of diffuseness of sound—is a measure of the non-directivity of sound at the location of an observer. A minimum diffuseness could indicate for example the exclusive arrival of direct sound from a single direction at the location of the observer, while a maximum diffuseness could indicate for example the exclusive arrival of diffuse sound at the location of the observer. The expression "diffuse sound" refers to non-direct sound of a sound field. It may comprise for example reflections of direct sound, that is, reverberation, and/or background noise. A diffuse sound field may be considered for example to comprise a number of sound waves with random phase and uniform directional distribution wherein the sound waves constituting the field are uncorrelated, whereas sound waves originating from a single source and propagating directly from the source to an observer are correlated. The diffuseness of sound could be estimated by determining at least one indicator having any desired, assumed relationship to the diffuseness of sound. For example, such an indicator could be assumed to be the higher the higher the diffuseness of sound, or it could be assumed to be the lower the higher the diffuseness of sound. The latter will also be referred to as opposing relationship between the indicator and the diffuseness of sound.

The apparatus furthermore forms at least one final audio signal based on at least one of the received first audio signal and the received at least second audio signal by adjusting an audibility of diffuse sound for the final audio signal in response to the estimated diffuseness, in order to enable an enhanced perception of sound with respect to at least one criterion with the at least one final audio signal. (action 203) The at least one final audio signal may be provided for instance for storage, transmission and/or presentation. The enhancement in perception may be understood as an improvement compared to a perception that could be achieved with the first audio signal or the received at least second audio signal without adjustment of the audibility of diffuse sound.

Certain embodiments of the invention thus provide that diffuseness in received audio signals originating from a plurality of microphones of a single device is estimated and used for adjusting the audibility of the diffuse sound for a final audio signal.

Using a plurality of microphones may have effect that direct sound in the environment of the device can be captured more comprehensively. Adjusting the audibility of the diffuse sound may have the effect that the perception of the captured sound may be improved with respect to a criterion that is considered relevant for a particular use case. Such a criterion could be for example any criterion that may be suited for rating the perception of the sound that is enabled with the at least one formed final audio signal.

Figure 2:
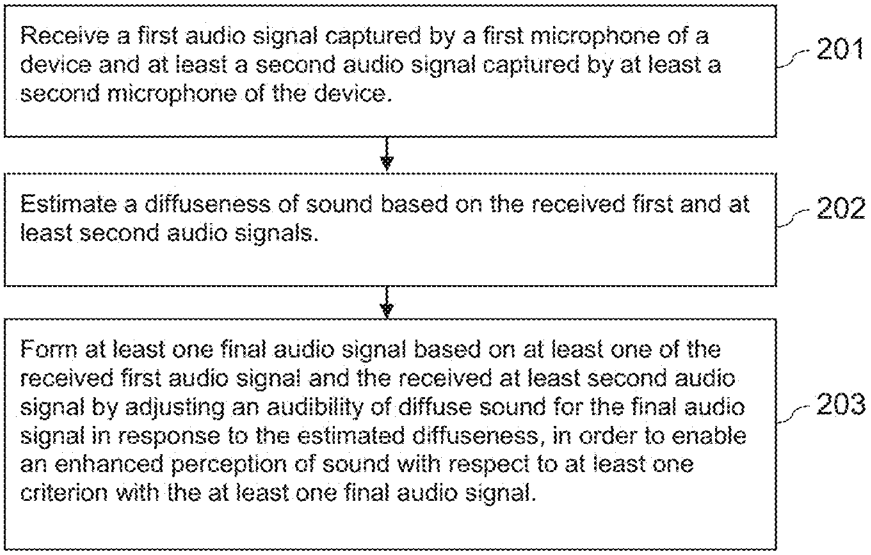
FIG. 2 is a flow chart illustrating an example operation of the apparatus of FIG. 1.

Apparatus 100 illustrated in FIG. 1 and the method illustrated in FIG. 2 may be implemented and refined in various ways.

In an example embodiment, the at least one criterion comprises clarity of sound, spaciousness of sound or preservation of reverberation.

In an example embodiment adjusting the audibility of diffuse sound comprises reducing the audibility of diffuse sound. This may have the effect that the clarity of captured sound and especially the clarity of captured speech can be improved in a final audio signal. In another example embodiment adjusting the audibility of diffuse sound comprises increasing the audibility of diffuse sound. This may allow producing an effect of an increased spaciousness and/or reverberation.

A sound spaciousness enhancement feature could be for example a part of a 3D audio application or associated software processing to enable spaciousness.

In an example embodiment, estimating a diffuseness of sound comprises estimating a diffuseness of sound in each of a plurality of frequency bins. Adjusting the audibility of diffuse sound may then comprise weighting an audio signal in at least one of the plurality of frequency bins with a factor that is determined based on the diffuseness of sound estimated for the frequency bin to obtain frequency bins with adjusted audio signals, wherein the audio signals that are weighted are based on at least one of the received first audio signal and the received at least second audio signal. Forming the at least one final audio signal may then comprise combining the frequency bins with the adjusted audio signals in order to obtain the at least one final audio signal. Weighting an audio signal may be understood to comprising weighting the level of the audio signal.

Weighting audio signals that are based on at least one of the received first audio signal and the received at least second audio signal can mean, for example, that one or each of the received first audio signal in the at least one frequency bin and the received at least second audio signal in the at least one frequency bin are weighted, or that a combination of the received first audio signal and the received at least second audio signal in the at least one frequency bin is weighted. It is to be understood that the weighting could optionally be performed only after some other processing of the received audio signals.

Weighting the audio signals on a frequency bin basis based on an estimated diffuseness may have the effect that certain portions of the audio signals are attenuated or emphasized in relation to other portions. This may allow adjusting the level of diffuse sounds in relation to direct sounds as desired for a respective certain use case.

It is to be understood that estimating a diffuseness of sound in each of a plurality of frequency bins and weighting an audio signal in at least one of the plurality of frequency bins may be performed for respective ones of consecutive parts of the first audio signal and the at least second audio signal.

In an example embodiment, the received first audio signal and the received at least second audio signal are combined in each of the frequency bins. The weighting of the audio signal may then comprise weighting the combined audio signal in the at least one frequency bin. The combining may comprise a summing of the signals with different gains for audio signals that are captured by different microphones. The gains could be set in the design phase of the device. The gains could also be frequency dependent. This way, different frequency responses and different directivities of the microphones may be taken into account.

Applying the weighting to combined signals may have the effect that the weighting only has to be carried out once for each frequency bin. This approach may be particularly efficient, in case only a single audio channel is desired for storage, transmission or presentation anyhow.

In another example embodiment, in contrast, the weighting of the audio signal comprises weighting the received first audio signal in at least one of the plurality of frequency bins to obtain frequency bins with adjusted first audio signals and weighting the received at least second audio signal in at least one of the frequency bins to obtain frequency bins with adjusted second audio signals. Combining the frequency bins with the adjusted audio signals may then comprise combining the frequency bins with adjusted first audio signals to obtain a first final audio signal, and combining the frequency bins with adjusted second audio signals to obtain a second final audio signal.

This may have the effect that the resulting first and second final audio signals can be used either for a monophonic audio presentation or for a multi-channel audio presentation with reduced or increased diffuse sound. For the monophonic audio presentation, simply one of the obtained final audio signals may be used, or the obtained final audio signals may be combined before presentation via a single loudspeaker.

The factor that is used for weighting audio signals in at least one frequency bin may be selected in various ways.

In an example embodiment, the factor for the at least one frequency bin is selected from among at least two factors, a lower one of the at least two factors being associated with at least one first estimated diffuseness of sound and a higher one of the at least two factors being associated with at least one second estimated diffuseness of sound, wherein the at least one first estimated diffuseness of sound is lower than the at least one second estimated diffuseness of sound. This may have the effect that diffuse sound is attenuated in the final audio signals.

In another example embodiment, the factor for the at least one frequency bin is selected from among at least two factors, a lower one of the at least two factors being associated with at least one first estimated diffuseness of sound and a higher one of the at least two factors being associated with at least one second estimated diffuseness of sound, wherein the at least one first estimated diffuseness of sound is higher than the at least one second estimated diffuseness of sound. This may have the effect that diffuse sound is emphasized in the final audio signals.

In another example embodiment, the factor for the at least one frequency bin is selected from a plurality of factors, wherein a single factor is associated with any estimated diffuseness of sound exceeding a predetermined limit. This may have the effect that whenever the captured sound can be assumed to be essentially direct sound, no or little adjustment can be applied.

In another example embodiment, the factor for the at least one frequency bin is selected to be the lower, the higher the estimated diffuseness of sound, at least as long as the estimated diffuseness of sound exceeds a predetermined limit. This may have the effect that attenuation is the stronger, the higher the estimated diffuseness of sound in a frequency bin. Such a differentiated attenuation may result in particularly clear final audio signals. If the diffuseness of sound is estimated for example by determining an indicator with an assumed opposing relationship to the diffuseness of sound, the weighting factor could also be, for example, identical to the indicator.

In another example embodiment, the factor for the at least one frequency bin is selected to be the higher the higher the estimated diffuseness of sound, at least if the estimated diffuseness of sound exceeds a predetermined limit. This may have the effect that the intensification of diffuse sound is the stronger, the higher the estimated diffuseness of sound in a frequency bin. Such a differentiated attenuation may be suited to emphasize the natural distribution of the original diffuse sound to different frequency bins.

It is to be understood that if the diffuseness of sound is estimated for example by determining an indicator with an assumed direct relationship to the diffuseness of sound, it could be determined in each case whether the estimated diffuseness of sound exceeds a predetermined limit by checking whether the indicator exceeds a predetermined threshold value; while if the diffuseness of sound is estimated for example by determining an indicator with an assumed opposing relationship to the diffuseness of sound, it could be determined in each case whether the estimated diffuseness of sound exceeds a predetermined limit by checking whether the indicator falls short of a predetermined threshold value, etc.

The diffuseness of sound can be estimated in many ways, for instance by determining any suitable indicator having an assumed relationship to the diffuseness of sound as mentioned above.

In an example embodiment, the diffuseness of sound may be estimated by computing a correlation value for the received first audio signal and the received at least second audio signal in each of the plurality of frequency bins. This approach may have the effect that it is particularly simple. It is suited in particular for lower frequency bins. The highest considered frequency bin may be selected based on the relation between the shortest contained wavelength and the distance between the first microphone and the at least second microphone. Higher frequency bins may be attenuated or muted on a general basis or not be adjusted on a general basis. The correlation value may be the maximum correlation value achieved by correlating the received first audio signal and the received at least second audio signal with different time shifts to each other. The correlation value may be normalized, for example, for comparability.

In an alternative embodiment, the diffuseness of sound may be estimated by computing a convolution value for the received first audio signal and the received at least second audio signal in each of the plurality of frequency bins. A convolution being very similar to a cross-correlation, the same effects may be achieved.

In an alternative embodiment, the diffuseness of sound may be estimated by computing a magnitude squared coherence value for the received first audio signal and the received at least second audio signal in each of the plurality of frequency bins. In a further alternative embodiment, the diffuseness of sound may be estimated by computing a speed of variation in sound arrival direction based on the received first audio signal and the received at least second audio signal in each of the plurality of frequency bins. In a further alternative embodiment, the diffuseness of sound may be estimated by combining the received first audio signal and the received at least second audio signal in each of the plurality of frequency bins, and by computing a relation between an intensity of sound to an energy density of sound for each of the plurality of frequency bins. Each of these alternatives may have the effect that it is suited for evaluating all frequency bins.

In an example embodiment, the first audio signal and the at least second audio signal are processed for obtaining exclusively a monophonic audio signal, the monophonic audio signal constituting the at least one final audio signal. That is, there may be only a single resulting channel and no side band information. This may have the effect that the presented approach enables an improvement of audio signals with limited processing power for certain use cases. For instance, there is no need to determine and/or rearrange directions of arrival of sound, etc. The required processing may be practicable as well for mobile devices with rather low level implementations.

Furthermore, the targeted improvement in sound may be most prominent when the audio signals are to be provided for immediate or later presentation in a monophonic format and/or to be played back in monophonic format with a single integrated loudspeaker of the same device comprising the at least two microphones or of another device. When generating a pure monophonic audio signal based on signals captured by a plurality of microphones, the audio signal is stripped of all directional cues as all sound is reproduced by a single loudspeaker. In certain embodiments, adjusting audio signals based on a determined diffuseness of sound and thereby reducing the diffuseness in the output signal may have the effect that the sound clarity may be maintained or increased without preserving the spatial information of the original sound field. In other embodiments, adjusting audio signals based on a determined diffuseness of sound and thereby increasing the diffuseness in the output signal may have the effect that a certain impression of spaciousness or reverberation can be maintained even with a monophonic audio signal.

In an example embodiment, the actions of estimating a diffuseness of sound and of forming at least one final audio signal are performed only in response to a user selection of a sound enhancement feature. This may have the effect that the natural quality of the captured audio signals can be preserved in some situations. The sound enhancement feature could be for example a sound clarity enhancement feature. If such a feature is not selected, this may have the effect that the natural quality of the captured audio signals, including for example background noise and/or intended reverberation, can be preserved in situations, in which the overall sound quality is considered to be more important than the intelligibility of speech or clarity of other direct sound. The sound enhancement feature could further be for example a sound spaciousness enhancement feature. If such a feature is not selected, this may have the effect that the natural quality of the captured audio signals, including the natural clarity of direct sound, can be preserved in some situations, in which clarity of direct sound is considered to be more important than an impression of spaciousness. In some embodiments a user selection could be required each time audio signals are captured by the at least two microphones, while in other embodiments the user selection could be stored in a general setting that is considered valid until the general setting is changed by a further user input deselecting the sound enhancement feature.

In an example embodiment, a user may select a predetermined criterion or one of a plurality of predetermined criteria for an improved perception of sound by selecting a particular sound enhancement feature.

In an example embodiment, the apparatus configured to perform the estimating of diffuseness of sound and the forming of at least one final audio signal is the device comprising the first microphone and the at least second microphone or a part of the device comprising the first microphone and the at least second microphone.

In an example embodiment, the device is configured to support a telephony application, and at least one of the first microphone and the at least second microphone is provided for use with the telephony application. This may have the effect that the microphones may be used for several purposes.

In an example embodiment, the device comprises a single loudspeaker. This may have the effect that the same device may be used for capturing audio signals via several microphones and for presenting comprehensive and yet clear monophonic audio signals based on the captured audio signals. It is understood that the final audio signal can be reproduced over multiple loudspeakers.

In an example embodiment, the device allows capturing audio signals along with video signals. Even when stereophonic capture of audio signals is used, a captured video will often be played back using the same or a similar portable device with a single loudspeaker. This constitutes thus a particular use case for certain embodiments of the invention.

In an example embodiment, the device is at least one of a mobile device, a mobile computing device, a mobile phone, a smartphone, a tablet computer and a video camera. This may have the effect that devices which do not allow for an optimal arrangement of microphones for capturing stereophonic audio signals can be used for obtaining comprehensive and yet clear sound.

Figure 3:
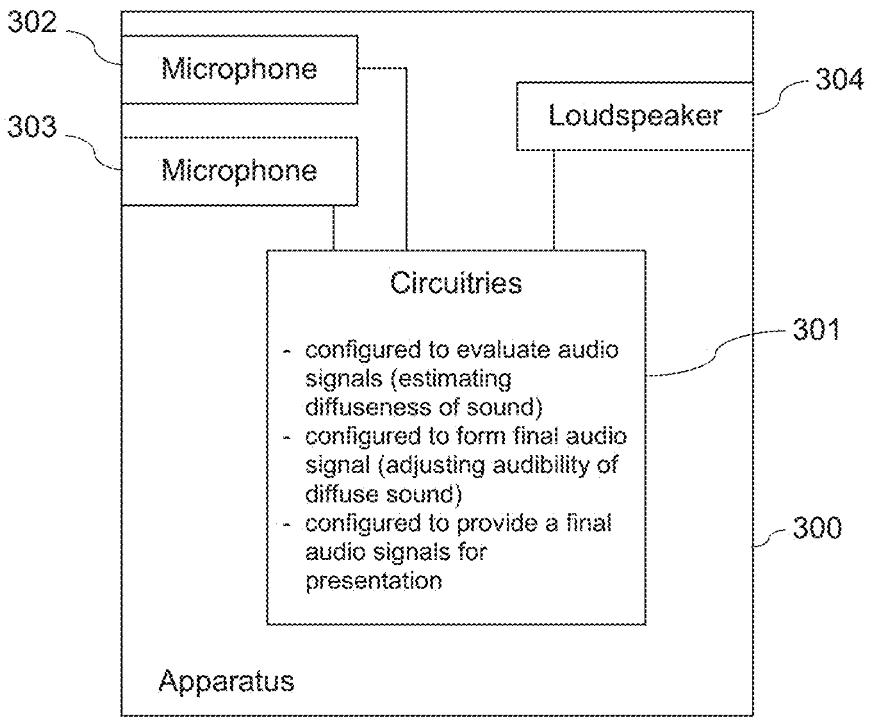
FIG. 3 is a schematic block diagram of a further example apparatus.

FIG. 3 is a schematic block diagram of another example apparatus 300.

Apparatus 300 may be for instance a mobile device. It comprises circuitries 301 for processing audio signals and, linked to the circuitries, two microphones 302, 303 and a single loudspeaker 304. The circuitries 301 may comprise a circuitry configured to evaluate received audio signals. The audio signals may be received from microphones 302, 303, similar as described with reference to action 201 of FIG. 2, and the evaluation may comprise for example an estimating of the diffuseness of sound, similar as described with reference to action 202 of FIG. 2. The circuitries 301 may further comprise a circuitry configured to form at least one final audio signal based on audio signals received from at least one of microphones 302, 303. Forming a final audio signal may comprise for example an adjustment of the audibility of diffuse sound for the final audio signal, similar as described with reference to action 203 of FIG. 2. The circuitries 301 may finally comprise a circuitry configured to provide a final audio signal for presentation via loudspeaker 304. Apparatus 300 is an example embodiment of an apparatus according to the invention.

Figure 4:
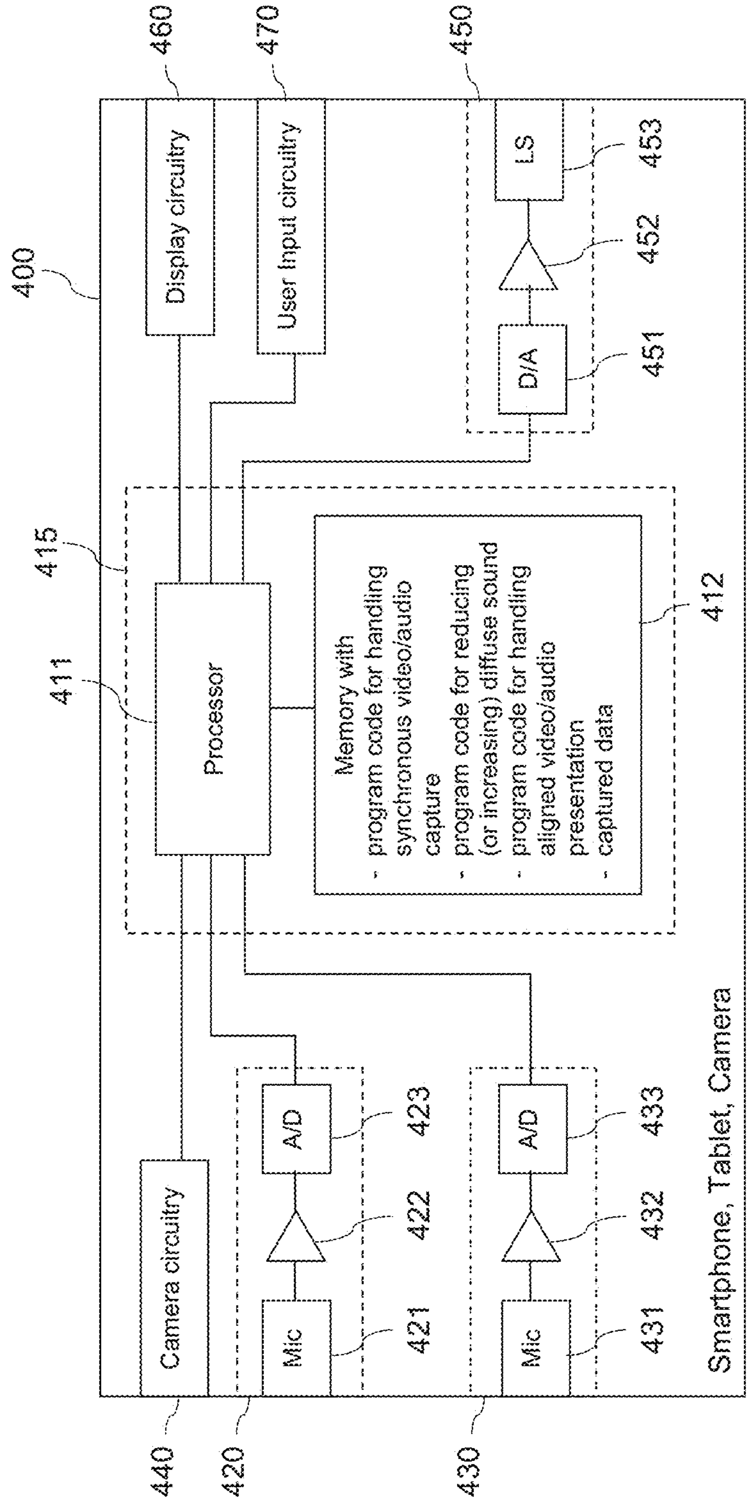
FIG. 4 is a schematic block diagram of an example device.

FIG. 4 is a schematic block diagram of an example device 400.

By way of example, device 400 is assumed to be a smartphone, a tablet computer, a video camera or some other mobile device. It comprises a processor 411 and, linked to the processor 411, a memory 412, a first microphone circuitry 420, a second microphone circuitry 430, a camera circuitry 440, a loudspeaker circuitry 450, a display circuitry 460 and a user input circuitry 470.

Processor 411 is configured to execute computer program code, including computer program code stored in memory 412, in order to cause device 400 to perform desired actions.

Memory 412 stores computer program code for handling a synchronous capturing of video and audio signals. Memory 412 furthermore stores computer program code for processing captured audio signals. For a first use case, the processing may be aimed at reducing diffuse sound in the captured audio signals. For a second use case, the processing may be aimed at increasing diffuse sound in the captured audio signals. One or both of the use cases may be supported by device 400. In addition, memory 412 could store computer program code configured to realize other functions, like computer program code for processing captured video signals and/or computer program code for handling a storage, transmission or presentation of aligned audio and video signals. In addition, memory 412 could also store captured audio or video data, or any other kind of data.

Processor 411 and memory 412 may optionally belong to a chip or an integrated circuit 415, which may comprise in addition various other components, for instance a further processor or memory.

First microphone circuitry 420 may comprise a microphone 421, an analog amplifier 422 and an analog-to-digital converter 423. Second microphone circuitry 430 may equally comprise a microphone 431, an analog amplifier 432 and an analog-to-digital converter 433. If device 400 enables telephone conversations, microphones 421, 431 may be microphones which are also used in combination for noise reduction in telephony usage. Due to various spatial constraints, microphones 421, 431 of device 400 may be not be arranged optimally for any intended purpose, for example for stereo capture or for some signal processing method requiring exactly balanced directivity patterns.

Camera circuitry 440 may comprise components suited to capture video signals. Loudspeaker circuitry 450 may comprise a digital-to-analog converter 451, an analog amplifier 452 and the only loudspeaker 453 of device 400. Display circuitry 460 may comprise components suited to display provided image data on a screen. User input circuitry 470 may comprise components suited to enable a user input. Such components could include for example keys, buttons and/or a touchscreen. A touchscreen could be combined with the screen of display circuitry 460. Component 415 or device 400 could be an example embodiment of an apparatus according to the invention.

It is to be understood that device 400 could comprise various additional components not shown. Just to provide a few examples, it could comprise further microphone circuitries with a further microphones, in particular a third microphone circuitry with a third microphone; and if device 400 is a mobile communication device, like a smartphone, it could comprise a cellular engine with an associated transceiver.

Figure 5:
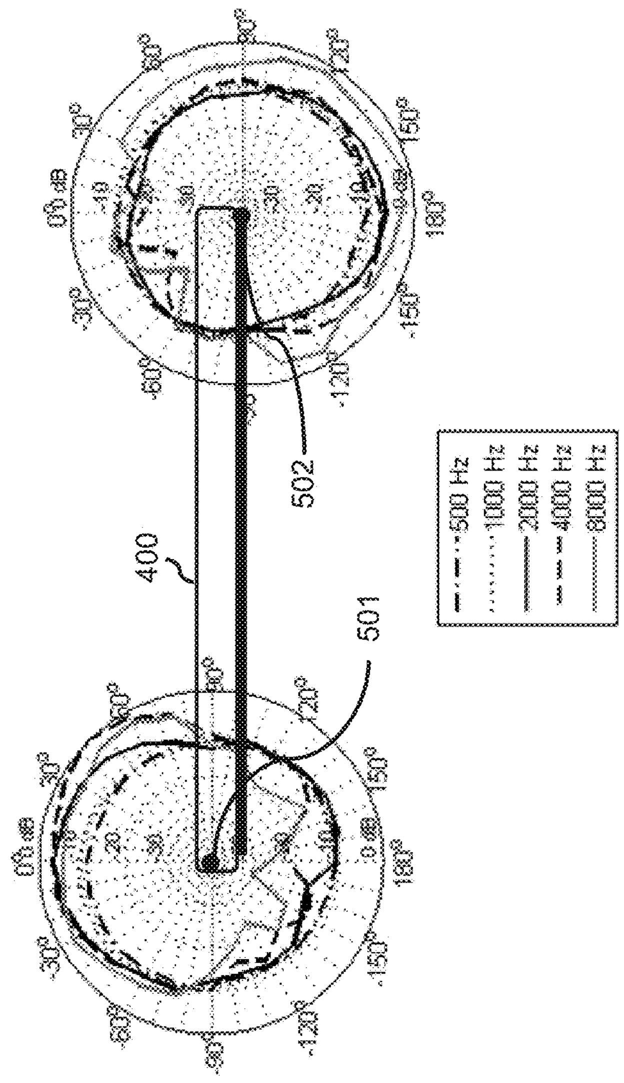
FIG. 5 is a schematic diagram illustrating possible microphone inlet locations and microphone directivity patterns for the device of FIG. 4.

An example arrangement of the microphone inlet locations of microphones 421, 431 of device 400 is illustrated in FIG. 5. FIG. 5 presents a side view onto device 400, which is illustrated as a rectangle. A thick line indicates the location of a display. The microphone inlet location of microphone 421 is marked by a first black dot 501, and the microphone inlet location of microphone 431 is marked by a second black dot 502. For each microphone, an example microphone directivity pattern for frequencies of 500 to 8000 Hz is shown.

FIG. 6 is a flow chart illustrating first example operations at device 400. The first example operations aim at increasing the relative level of direct sound compared to diffuse sound in captured audio signals to obtain an increased clarity of sound. Processor 411 and some of the program code stored in memory 412 cause device 400 to perform the presented operations when the program code is retrieved from memory 412 and executed by processor 411. Some or all of the operations constitute an example embodiment of a method according to the invention.

When a user of device 400 starts a video recording via user input circuitry 470, camera circuitry 440 and microphone circuitries 420, 430 are activated to capture video signals and sound signals, respectively.

The audio signals captured by microphones 421 and 431 and thus received by device 400 (action 601) are processed at first separately in the respective microphone circuitry 420, 430.

The audio signals are amplified by amplifier 422 and 432, respectively (action 602).

The captured and amplified analog audio signals are then converted into digital audio signals by means of analog-to-digital converter 423 and 433, respectively. (action 603) The conversion can be realized by a sampling of the audio signals in the time domain.

The audio signals may then be received at processor 411 as two channels for further processing in the digital domain.

In the example embodiment, the following operations are performed only, in case the user selected a sound clarity enhancement feature as an example sound enhancement feature. This feature may be selected for example, if clarity of sound in general or clarity of speech in particular is a relevant criterion of perception for the user in a particular use case. (action 604) Otherwise, the captured audio data could simply be stored, transmitted or presented along with the captured video data without further processing.

If the user selected the sound clarity enhancement feature, the audio signals of a particular time interval of each microphone 421, 431 are split up into a plurality of frequency bins. This can be achieved by filtering. (action 605) For example, frequencies of 0 to 24 kHz could be divided into 24 bands having a width of 1 kHz each. It is to be understood that any other frequency range could be selected, that any other number and width of frequency bins could be used, and that the width of frequency bins does not have to be equal. For the filtering, each channel may first be converted into the frequency domain, for instance by means of a fast Fourier transform (FFT); and after the splitting up into frequency bins, the signals in each frequency bin can be converted again into the time domain, for instance by means of an inverse fast Fourier transform (IFFT). The length of the time interval used for the conversion into the frequency domain can be selected arbitrarily, it could be set for instance to 0.5 seconds.

Next, the diffuseness of sound in each frequency bin is estimated. (action 606) It is to be understood that some frequency bins may be excluded from the estimation, for instance a highest and/or a lowest frequency bin.

There are various possible approaches for performing the estimation.

In a first approach, for example, the sound diffuseness may be estimated by correlating the audio signals of the two channels separately for each of the frequency bins and by finding the maximum correlation value for each frequency bin. The length of the time interval for the correlation can be selected arbitrarily; it could be set for instance to 0.1 seconds. The steps for shifting the samples of the channels against each other for finding the maximum value can equally be selected arbitrarily; they could be set for instance to 0.05 seconds. The correlation values could be normalized to lie between 0 and 1, and the higher the maximum correlation value for a frequency bin, the lower is the diffuseness of sound. Since the highest frequencies have a low correlation due to the distance between microphones 421, 431, the highest frequencies could be excluded from the evaluation and later be muted in the output or used without adjustment. Instead of a correlation, a convolution of the audio signals could be used, which is very similar to a correlation.

In a second approach, for example, the sound diffuseness may be estimated by computing a magnitude squared coherence (MSC) value between the audio signals of the two channels separately for each of the frequency bins. The magnitude squared coherence value indicates the linear dependency between two signals x and y in the time domain and thus how well the signals match with each other. It can be computed for example by means of the following equation:

$$C_{xy} = \frac{|G_{xy}|^2}{G_{xx}G_{xy}},$$

where $G_{xy}$ is the cross-spectral density between x and y and where $G_{xx}$ and $G_{yy}$ are the auto-spectral density of x and y, respectively. The notation | . . . | denotes the magnitude of the spectral density. Again, the estimated diffuseness of sound in a frequency bin would have an opposing relationship to the determined magnitude squared coherence value. Details for a possible computation of a magnitude squared coherence value as a measure of diffuseness can also be taken for instance from the document "Parameter Estimation in Directional Audio Coding Using Linear Microphone Arrays", by Oliver Thiergart et al, Audio Engineering Society, Convention Paper 8434, 130th Convention, 2011 May 13-16, London, UK.

In a third approach, for example, the sound diffuseness may be estimated for each of the frequency bins by computing the speed of variation of sound arrival direction. The speed of variation of sound arrival direction can be measured for example by first estimating the sound arrival direction (angle 'A') and then computing the finite difference between 'A' values of subsequent time frames. When 'A' is stable, the sound in that frequency bin is regarded as direct. When 'A' is rapidly varying, it is regarded as diffuse. The finite difference value of 'A', or a corresponding normalized value, can be used in this approach as the estimated diffuseness of sound. 'A' is estimated by signal level and delay differences between the microphone channels in each frequency bin. A crude estimate in a two-dimensional (2D) plane can be made using two microphones, while the use of more channels enables a better accuracy and three-dimensional (3D) solutions, if the microphones are not located on same plane.

Once a value reflecting an estimated diffuseness of sound is available, it may be determined for each frequency bin, whether the estimated diffuseness of sound exceeds a predetermined diffuseness. (action 607) For example, if the estimated diffuseness can be any value from 0 to 1, with 0 indicating no diffuse sound and 1 indicating diffuse sound only, the threshold value could be set to 0.2 or 0.3. Any other value could be chosen as well. It is to be understood that in case the diffuseness of sound is estimated for example by determining maximum correlation values or magnitude squared coherence values, there is no need to determine a separate estimated diffuseness of sound. In this case, higher values can simply be interpreted as lower diffuseness of diffuse sound and lower values can be interpreted as higher diffuseness of diffuse sound. The predetermined diffuseness may then be considered to be exceeded in action 606, if a determined correlation value or the determined magnitude squared coherence value falls short of a corresponding predetermined threshold value. If the values could lie in a range of 0 to 1, the predetermined threshold value could be set for instance to 0.7 or 0.8. Any other value could be chosen as well.

In case the estimated diffuseness of sound does not exceed the predetermined diffuseness for a particular frequency bin, a weighting factor for this frequency bin is set for example to 1. (action 608) This means, that the strength of the audio signals in this frequency bin will not be reduced. This may have the effect that most of the direct sound is preserved with the original strength.

In case the diffuseness of sound exceeds the predetermined diffuseness for a particular frequency bin, a weighting factor for this frequency bin is set to a value smaller than 1. (action 609) It is possible to use a single predetermined value to this end. The factor could be set for instance to 0. It could also be set to a value slightly higher than 0, like 0.1, in order to prevent the complete loss of direct sound in frequency bins with an estimated high diffuseness of sound and/or to keep the result more natural.

Alternatively, it would also be possible to select one of a plurality of different weighting factors for each frequency bin, such that the weighting factor is the higher, the lower the estimated diffuseness of sound. In this case, actions 607 and 608 could also be omitted.

The audio signals originating from both microphones 421, 431 may now be combined in each frequency bin. (action 610) The combination may simply consist in a summing of the signals, optionally including a weighting with gains set in the design phase of device 400. Such a weighting allows taking into account of structural aspects, like different frequency responses and different directivities of microphones 421, 431. This weighting could also be performed by amplifiers 422, 432 already, though. Before summing the audio signals in each frequency bin, the audio signals may optionally be aligned in time, with the alignment corresponding to a maximum correlation value in the frequency bin. This may take account of the fact that depending on the location of a sound source, the sound may reach one of microphones 421, 431 earlier than the other.

Then, the combined audio signals may be weighted separately for each frequency bin with the factor that has been determined in actions 608 and 609 for the respective frequency bin. (action 611)

The processing of audio signals in different frequency bins in actions 606 to 611 may be performed subsequently or in parallel.

The adjusted frequency bins are combined again to obtain an audio signal over the entire frequency range. (action 612)

Subsequent overlapping or non-overlapping time intervals may be processed separately as described with reference to actions 605 to 612. The processing may take place subsequently for subsequent time intervals, for instance while further audio signals are still being captured by microphones 421 and 431, or in parallel, if the processing only takes place after the capture of audio signals has been completed.

Finally, subsequent time domain samples are combined to create a continuous, digital output signal as a final audio signal. (action 613)

The output signal can be provided for example for storage in memory 412 or in some other memory of device 400, for transmission to another device or for presentation via loudspeaker 453. In each case, the output audio signals could be provided such that they may be aligned in time with the captured video signals.

It is to be understood that the presented example operations may be varied in many ways.

For instance, the order of actions could be modified. To provide an example, all of actions 605-612 could also be carried out in the frequency domain. In this case, the conversion of the audio signals from the frequency domain to the time domain could be performed between actions 612 and 613, instead of in action 605.

It would also be possible to use more than two microphones, for instance three microphones. As mentioned before with reference to action 606, such a constellation could be exploited for example, in order to obtain refined results when using the speed of variation in sound arrival direction as a measure for diffuseness.

Device 400 could also comprise two or more loudspeakers. In this case, a generated monophonic final audio signal could also be reproduced over at least two speakers, meaning that the same final audio signal is provided to each speaker. In the case of handsfree speakers, this may have the effect that the loudness of the sound reproduction may be improved as well as clarity. The same kind of sound reproduction can be provided using headphones with right and left earpieces, with an identical signal being provided to right and left speaker. In this case, at least the clarity may be improved.

Furthermore, it would be possible to ensure that the factors that are set in actions 608 and 609 develop smoothly from one time interval to the next in each frequency bin. This could be achieved for instance by permitting a maximum difference in the factor from one time interval to the next.

Furthermore, the audio signals might not be combined in action 610 (as indicated by dashed lines in FIG. 6). In this case, the weighting factor determined for a frequency bin could be applied in action 611 separately to an audio signal in this frequency bin originating from microphone 421 and to an audio signal in this frequency bin originating from microphone 431. The audio signals could then be combined at a later stage, or at least two final audio signals forming at least two output channels, one for each microphone, could be provided in action 613.

The audio signals might furthermore not be combined in action 610, if they are already combined for estimating the diffuseness of sound in each frequency bin in action 606 using yet another approach: This further approach may comprise computing a relation between the intensity of sound and the energy density of sound for the combined audio signal in each frequency bin. The sound intensity is the product of the sound pressure and the particle velocity and indicates the sound power per area. The sound energy density is the sound energy per volume unit and indicates a sound energy value at a given location. In order to estimate the sound intensity and energy density at a given time, microphone pairs could be selected for example from at least three available microphones such that their directional patterns can be combined to approximate a monopole and dipoles. This can be achieved at sufficient accuracy even in mobile devices, since the actual direction of the dipole axis is less important for the suggested use case. It would be possible, for example, to use a set up of two microphones on the back side of a phone and one on the front side. Two dipoles that could be used for approximating the sound particle velocity can be constructed for example from three microphones. If there are two microphones on the back cover of a phone or at both ends of it, their integration can be designed so as to produce different enough directional patterns at least at high frequencies (above 1 kHz, for example) so that a dipole pair can be approximated by combining their signals with adequate phase adjustment. This difference in directivity patterns may be in place anyhow, if the microphones are designed for stereo capture. Similarly, another pair can be constructed of microphones on front and back sides of the phone, which are optimized for directional audio capture and thus very well suited also for the presented use case. Another parameter needed for calculating the sound intensity is the sound pressure, which could simply be the signal of an omnidirectional microphone at the location of the two dipoles. This signal could be constructed with a suitable combination of some or all of the microphone signals, the weighted sum approximating an omnidirectional pattern.

In contrast to the first example operations presented with reference to FIG. 6, second example operations at device 400 may aim at increasing the relative level of diffuse sound compared to direct sound in captured audio signals to obtain increased reverberation or an enhanced spatial character.

The second operations may be largely the same as the first operations presented with reference to FIG. 6. The differences are illustrated in FIG. 6*b* with actions 604*a* and 609*a*. Other actions are provided with the same reference signs as corresponding actions illustrated in FIG. 6 and only presented to a limited extent.

Audio signals captured by at least two microphones 621, 631 may be received and processed as described with reference to actions 601 to 603 of FIG. 6.

For the second example operations, the user may now select a sound spaciousness enhancement feature as an example sound enhancement feature. This feature may be selected for example, if spaciousness of sound in general or preservation (or enhancement) of reverberation is a relevant criterion of perception for the user. If it is determined that this feature is selected (action 604*a*), the diffuseness of sound is estimated in each frequency bin as described with reference to actions 605 and 606 of FIG. 6. In case the estimated diffuseness falls short of a predetermined limit, the weighting factor may be set for example to 1, as described with reference to actions 607 and 608 of FIG. 6.

However, if it is determined in action 604*a* that the sound spaciousness enhancement feature is selected and if it is determined in action 607 that the diffuseness of sound exceeds the predetermined limit for a particular frequency bin, a weighting factor for this frequency bin is set to a value larger than 1. (action 609*b*) It is possible to use a single predetermined value to this end. Such a factor could be set for instance to 1.5. It could also be set to any other value larger than 1. The value may be selected to be not too high, in order to prevent the complete drowning out of direct sound in other frequency bins. Alternatively, it would also be possible to select one of a plurality of different weighting factors for each frequency bin, such that the weighting factor is the higher, the higher the estimated diffuseness of sound. In this case, actions 607 and 608 could also be omitted. A range of possible weighting factors could be for instance 1 to 2, mapped to a possible range of diffuseness of 0 to 1.

The further operations may then correspond again to the operations described with reference to actions 610 to 613 of FIG. 6.

If the sound spaciousness enhancement feature is determined not to be selected in action 604*a*, this may mean that no sound enhancement feature is selected. In this case, the captured audio data could simply be stored, transmitted or presented along with the captured video data without further processing.

However, device 400 could optionally support both a sound clarity enhancement feature and a sound spaciousness enhancement feature. If the sound spaciousness enhancement feature is determined not to be selected in action 604*a* in this case, the operations could also continue with action 604 of FIG. 6 to determine whether the sound clarity enhancement feature is selected.

Summarized, certain embodiments of the invention may have a positive impact on intelligibility of speech or clarity of other direct sound captured by several microphones of a single device. Non-diffuse sounds may be preserved even if they are captured outside of the narrow beam of a typical directional microphone. Such sounds may represent interesting events, like persons or vehicles outside of a picture area, if the sound is captured along with a video. If used together with directional microphones or different audio zoom or audio focus functions, certain embodiments may have the effect of further increasing the clarity of the captured audio. The clarity improvement may be particularly noticeable when the audio is played back by a device that has only a monophonic loudspeaker. As the frequency response of such integrated speakers may be very limited, reduction of diffuse sound at high frequencies may have significant effects on clarity of the output audio signal. Other embodiments of the invention may have a positive impact on the impression of spaciousness of sound captured by several microphones of a single device.

The processor(s) used in any of the above described embodiments could also be used for additional operations that are conventionally handled by cellular engines or other components.

Any presented connection in the described embodiments is to be understood in a way that the involved components are operationally coupled. Thus, the connections can be direct or indirect with any number or combination of intervening elements, and there may be merely a functional relationship between the components.

Further, as used in this text, the term 'circuitry' refers to any of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that requires software or firmware for operation, even if the software or firmware is not physically present.

This definition of circuitry applies to all uses of this term in this application, including in any claims. As a further example, as used in this application, the term circuitry also covers an implementation of merely a processor (or multiple processors) or portion of a processor and its (or their) accompanying software and/or firmware. The term circuitry also covers, for example and if applicable to the particular claim element, a baseband integrated circuit or applications processor integrated circuit for a mobile phone or a similar integrated circuit in server, a cellular network device, or other network device.

Any of the processors mentioned in this text could be a processor of any suitable type. Any processor and memory may comprise but is not limited to one or more single-core processor(s), one or more dual-core processor(s), one or more multi-core processor(s), one or more microprocessor (s), one or more digital signal processor(s), one or more processor(s) with accompanying digital signal processor(s), one or more processor(s) without accompanying digital signal processor(s), one or more special-purpose computer chips, one or more field-programmable gate arrays (FPGAS), one or more controllers, one or more application-specific integrated circuits (ASICS), or one or more computer(s). The relevant structure/hardware has been programmed in such a way to carry out the described function.

Any of the memories mentioned in this text could be implemented as a single memory or as a combination of a plurality of distinct memories, and may comprise for example a read-only memory, a random access memory, a flash memory or a hard disc drive memory etc.

Moreover, any of the actions described or illustrated herein may be implemented using executable instructions in a general-purpose or special-purpose processor and stored on a computer-readable storage medium (e.g., disk, memory, or the like) to be executed by such a processor. References to 'computer-readable storage medium' should be understood to encompass specialized circuits such as FPGAs, ASICs, signal processing devices, and other devices.

Figure 7:
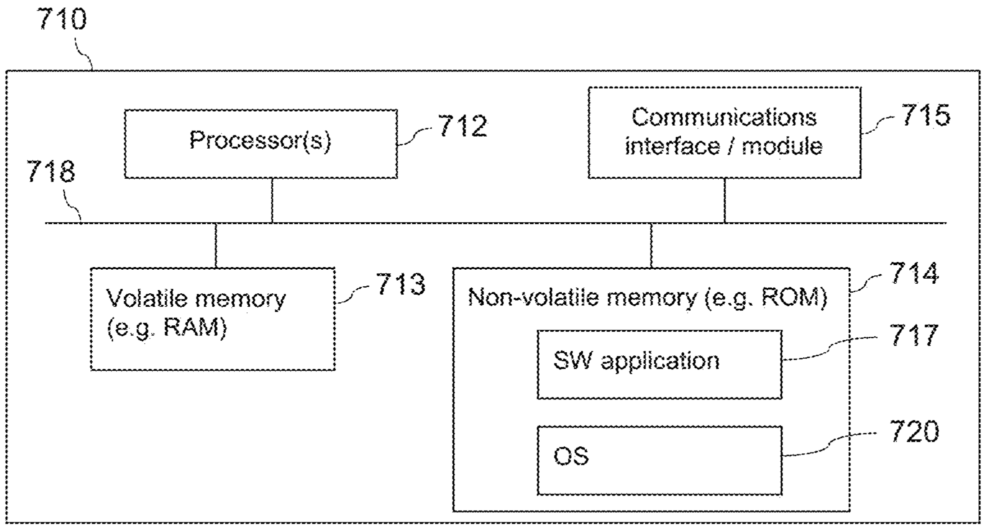
FIG. 7 is a schematic block diagram of an example embodiment of an apparatus.
Figure 8:
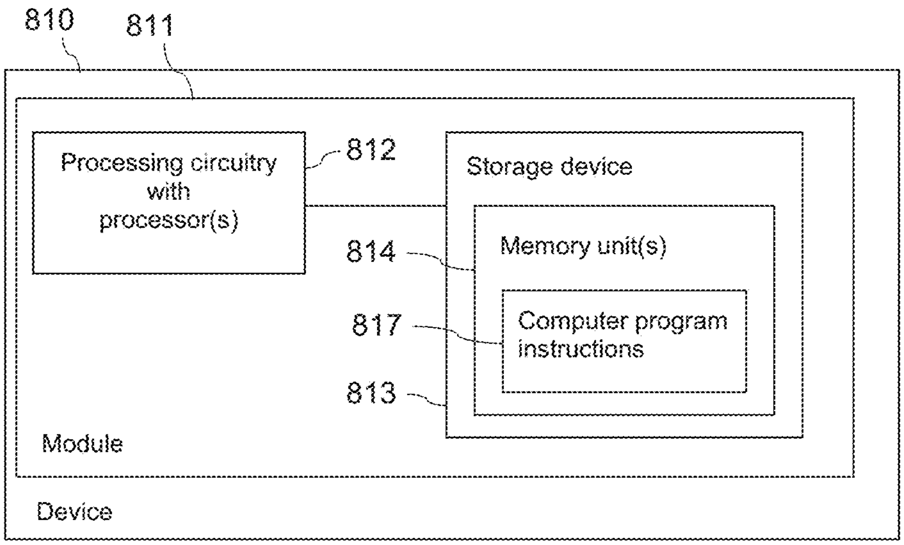
FIG. 8 is a schematic block diagram of an example embodiment of an apparatus.

Example embodiments using at least one processor and at least one memory as a non-transitory data medium are shown in FIGS. 7 and 8.

FIG. 7 is a schematic block diagram of a device 710. Device 710 includes a processor 712. Processor 712 is connected to a volatile memory 713, such as a RAM, by a bus 718. Bus 718 also connects processor 712 and RAM 713 to a non-volatile memory 714, such as a ROM. A communications interface or module 715 is coupled to bus 718, and thus also to processor 712 and memories 713, 714. Within ROM 714 is stored a software (SW) application 717. Software application 717 may be an application for recording and processing video data with associated sound, although it may take some other form as well. An operating system (OS) 720 also is stored in ROM 714.

FIG. 8 is a schematic block diagram of a device 810. Device 810 may take any suitable form. Generally speaking, device 810 may comprise processing circuitry 812, including one or more processors, and a storage device 813 comprising a single memory unit or a plurality of memory units 814. Storage device 813 may store computer program instructions that, when loaded into processing circuitry 812, control the operation of device 810. Generally speaking, also a module 811 of device 810 may comprise processing circuitry 812, including one or more processors, and storage device 813 comprising a single memory unit or a plurality of memory units 814. Storage device 813 may store computer program instructions that, when loaded into processing circuitry 812, control the operation of module 811.

The software application 717 of FIG. 7 and the computer program instructions 817 of FIG. 8, respectively, may correspond e.g. to the computer program code in any of memories 102 and 412.

Figure 9:
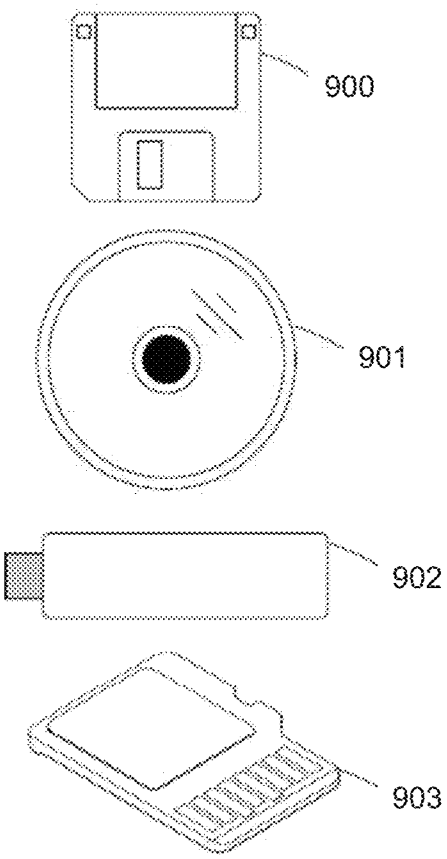
FIG. 9 schematically illustrates example removable storage devices.

In example embodiments, any non-transitory computer readable medium mentioned in this text could also be a removable/portable storage or a part of a removable/portable storage instead of an integrated storage. Example embodiments of such a removable storage are illustrated in FIG. 9, which presents, from top to bottom, schematic diagrams of a magnetic disc storage 900, of an optical disc storage 901, of a semiconductor memory circuit device storage 902 and of a Micro-SD semiconductor memory card storage 903.

The functions illustrated by processor 101 in combination with memory 102, or by circuitries 301, or by processor 411 in combination with memory 412, or by the integrated circuit 415 can also be viewed as means for receiving a first audio signal captured by a first microphone of a device and at least a second audio signal captured by at least a second microphone of the device; means for estimating a diffuseness of sound based on the received first and at least second audio signals; and means for forming at least one final audio signal based on at least one of the received first audio signal and the received at least second audio signal by adjusting an audibility of diffuse sound for the final audio signal in response to the estimated diffuseness, in order to enable an enhanced perception of sound with respect to at least one criterion with the at least one final audio signal.

The program codes in memories 102 and 412 can also be viewed as comprising such means in the form of functional modules.

Figure 6A:
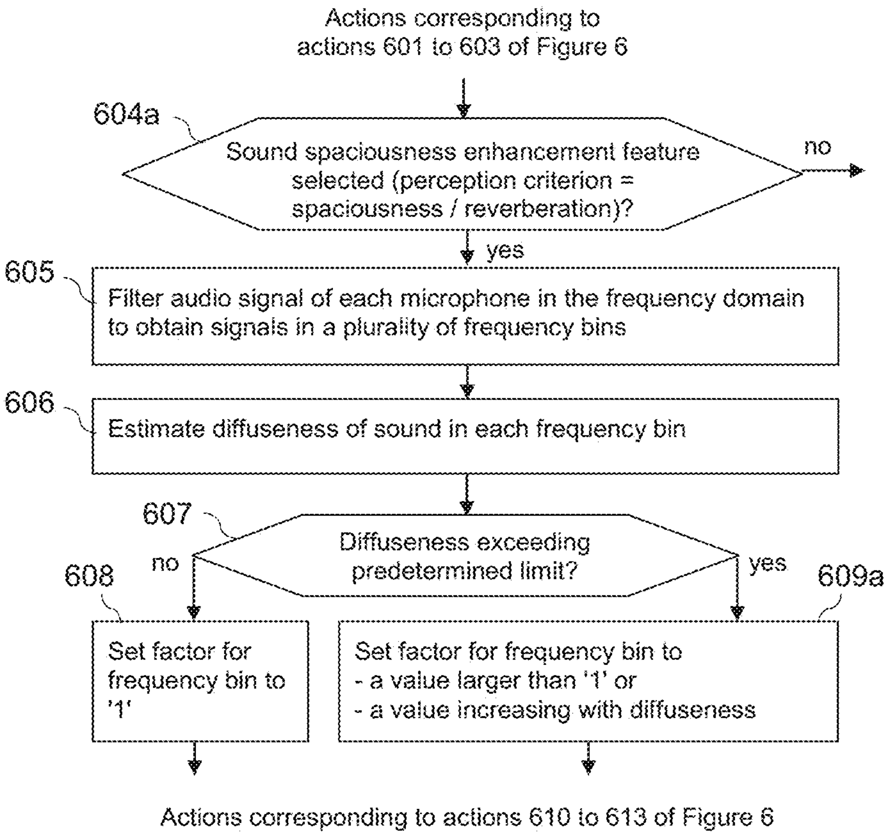
FIG. 6*a* is a flow chart illustrating a variation of the example operations illustrated in FIG. 6.

FIG. 2 and at least blocks 604 to 612 of FIG. 6—with block 604 of FIG. 6 optionally replaced by block 604*a* of FIG. 6*a* and block 609 of FIG. 6 optionally replaced by block 609*a* of FIG. 6*a*—may also be understood to represent example functional blocks of computer program codes supporting a processing of audio signals captured by at least two microphones.

It will be understood that all presented embodiments are only examples, that features of these embodiments may be omitted or replaced and that other features may be added. Any mentioned element and any mentioned method step can be used in any combination with all other mentioned elements and all other mentioned method step, respectively. It is the intention, therefore, to be limited only as indicated by the scope of the claims appended hereto.

What is claimed is:

1. A method comprising:

receiving, by an apparatus, a first audio signal captured by a first microphone and at least a second audio signal captured by at least a second microphone;

estimating, by the apparatus, a diffuseness of sound and at least one non-diffuse sound based on the received first audio signal and the received at least second audio signal; and forming, by the apparatus, a monophonic audio signal based on the received first audio signal and the received at least second audio signal by adjusting an audibility of at least one of the estimated diffuseness of sound and the estimated at least one non-diffuse sound for the monophonic audio signal in response to the estimating in order to control audibility of non-diffuse sound with respect to at least one criterion with the monophonic audio signal without preserving spatial information of a sound field captured by the first microphone and at least the second microphone.

2. The method according to claim 1, wherein the at least one criterion comprises one of:

clarity of sound;

spaciousness of sound; and preservation of reverberation.

3. The method according to claim 1, wherein adjusting the audibility of the estimated diffuseness of sound comprises one of:

reducing the audibility of diffuse sound; and increasing the audibility of diffuse sound.

4. The method according to claim 1, wherein estimating a diffuseness of sound comprises estimating a diffuseness of sound in each of a plurality of frequency bins, wherein adjusting the audibility of the estimated diffuseness of sound comprises weighting audio signals in at least one of the plurality of frequency bins with a factor that is determined based on the diffuseness of sound estimated for the at least one of the plurality of frequency bins to obtain at least one frequency bin with adjusted audio signals, wherein the audio signals that are weighted are based on at least one of the received first audio signal and the received at least second audio signal, and wherein forming the monophonic audio signal comprises combining the at least one frequency bin with the adjusted audio signals in order to obtain the monophonic audio signal.

5. The method according to claim 4, further comprising:

combining the received first audio signal and the received at least second audio signal in each of the plurality of frequency bins, wherein the weighting of the audio signals comprises weighting the combined audio signals in said at least one of the plurality of frequency bins.

6. The method according to claim 4, wherein the weighting of the audio signals comprises weighting the received first audio signal in at least one of the plurality of frequency bins to obtain at least one frequency bin with adjusted first audio signal and weighting the received at least second audio signal in the at least one of the plurality of frequency bins to obtain at least one frequency bin with adjusted second audio signal, and wherein combining the at least one frequency bin with the adjusted audio signals comprises combining the at least one frequency bin with adjusted first audio signal to obtain a first final audio signal, and combining the at least one frequency bin with adjusted second audio signal to obtain a second final audio signal.

7. The method according to claim 4, wherein the factor for the at least one frequency bin is selected from at least one of:

from among at least two factors, one of the at least two factors having a lower value being associated with at least one first estimated diffuseness of sound and one of the at least two factors having a higher value being associated with at least one second estimated diffuseness of sound, wherein the at least one first estimated diffuseness of sound is lower than the at least one second estimated diffuseness of sound;

from among at least two factors, one of the at least two factors having a lower value being associated with at least one first estimated diffuseness of sound and one of the at least two factors having a higher value being associated with at least one second estimated diffuseness of sound, wherein the at least one first estimated diffuseness of sound is higher than the at least one second estimated diffuseness of sound; and from a plurality of weighting factors, wherein a single factor is associated with any estimated diffuseness of sound exceeding a predetermined limit such that the factor has a higher value for a higher estimated diffuseness of sound, at least if the estimated diffuseness of sound exceeds the predetermined limit; and has a lower value for a lower estimated diffuseness of sound, at least if the estimated diffuseness of sound fails to satisfy the predetermined limit.

8. The method according to claim 4, wherein estimating the diffuseness of sound comprises one of:

computing a correlation value for the received first audio signal and the received at least second audio signal in each of the plurality of frequency bins, computing a convolution value for the received first audio signal and the received at least second audio signal in each of the plurality of frequency bins, computing a magnitude squared coherence value for the received first audio signal and the received at least second audio signal in each of the plurality of frequency bins, computing a speed of variation in sound arrival direction based on the received first audio signal and the received at least second audio signal in each of the plurality of frequency bins; or combining the received first audio signal and the received at least second audio signal in each of the plurality of frequency bins, and computing a relation between an intensity of sound to an energy density of sound for each of the plurality of frequency bins.

9. The method according to claim 1, wherein the first audio signal and the at least second audio signal are processed for obtaining exclusively the monophonic audio signal.

10. The method according to claim 1, wherein the apparatus further comprises:

at least one processor; and at least a single loudspeaker, wherein the apparatus is at least one of: a mobile device, a mobile computing device, a mobile phone, a smartphone, a tablet computer or a video camera, and wherein the apparatus is configured to at least one of: support a telephony application, wherein at least one of the first microphone and the at least second microphone is provided for use with the telephony application; or capture audio signals along with video signals.

11. An apparatus comprising:

at least one processor; and at least one memory including computer program code, the at least one memory coupled to the at least one processor, and the computer program code configured to, with the at least one processor, cause the apparatus at least to:

receive a first audio signal captured by a first microphone and at least a second audio signal captured by at least a second microphone;

estimate a diffuseness of sound and at least one non-diffuse sound based on the received first audio signal and the received at least second audio signal; and form a monophonic audio signal based on the received first audio signal and the received at least second audio signal by adjusting an audibility of at least one of the estimated diffuseness of sound and the estimated at least one non-diffuse sound for the monophonic audio signal in response to the estimate in order to control audibility of non-diffuse sound with respect to at least one criterion with the monophonic audio signal without preserving spatial information of a sound field captured by the first microphone and at least the second microphone.

12. The apparatus according to claim 11, wherein the at least one criterion comprises one of:

clarity of sound;

spaciousness of sound; and preservation of reverberation.

13. The apparatus according to claim 11, wherein the adjusted audibility of the estimated diffuseness of sound comprises one of:

reduced the audibility of diffuse sound; and increased the audibility of diffuse sound.

14. The apparatus according to claim 11, wherein the estimated diffuseness of sound comprises an estimated diffuseness of sound in each of a plurality of frequency bins, wherein the adjusted audibility of the estimated diffuseness of sound comprises weighting audio signals in at least one of the plurality of frequency bins with a factor that is determined based on the diffuseness of sound estimated for the at least one of the plurality of frequency bins to obtain at least one frequency bin with adjusted audio signals, wherein the audio signals that are weighted are based on at least one of the received first audio signal and the received at least second audio signal, and wherein the formed monophonic audio signal comprises combining the at least one frequency bin with the adjusted audio signals in order to obtain the monophonic audio signal.

15. The apparatus according to claim 14, wherein the at least one memory and the computer program code configured to, with the at least one processor, cause the apparatus to:

combine the received first audio signal and the received at least second audio signal in said each of the plurality of frequency bins; and weight the audio signals by weighting the combined audio signals in the at least one of the plurality of frequency bins.

16. The apparatus according to claim 14, wherein the at least one memory and the computer program code configured to, with the at least one processor, cause the apparatus to:

weight the audio signals by weighting the received first audio signal in at least one of the plurality of frequency bins to obtain at least one frequency bin with adjusted first audio signal and by weighting the received at least second audio signal in the at least one of the plurality of frequency bins to obtain at least one frequency bin with adjusted second audio signal; and combine the at least one frequency bin with the adjusted audio signals by combining the at least one frequency bin with adjusted first audio signal to obtain a first final audio signal, and by combining the at least one frequency bin with adjusted at least second audio signal to obtain a second final audio signal.

17. The apparatus according to claim 14, wherein the at least one memory and the computer program code configured to, with the at least one processor, cause the apparatus to select the factor for the at least one frequency bin from at least one of:

among at least two factors, one of the at least two factors having a lower value being associated with at least one first estimated diffuseness of sound and one of the at least two factors having a higher value being associated with at least one second estimated diffuseness of sound, wherein the at least one first estimated diffuseness of sound is lower than the at least one second estimated diffuseness of sound;

among at least two factors, one of the at least two factors having a lower value being associated with at least one first estimated diffuseness of sound and one of the at least two factors having a higher value being associated with at least one second estimated diffuseness of sound, wherein the at least one first estimated diffuseness of sound is higher than the at least one second estimated diffuseness of sound; and a plurality of weighting factors, wherein a single factor is associated with any estimated diffuseness of sound exceeding a predetermined limit to be one of such that the factor has a higher value for a higher estimated diffuseness of sound, at least if the estimated diffuseness of sound exceeds the predetermined limit; and has a lower value for a lower estimated diffuseness of sound, at least if the estimated diffuseness of sound fails to satisfy the predetermined limit.

18. The apparatus according to claim 14, wherein the estimated diffuseness of sound causes the apparatus to one of:

compute a correlation value for the received first audio signal and the received at least second audio signal in each of the plurality of frequency bins, compute a convolution value for the received first audio signal and the received at least second audio signal in each of the plurality of frequency bins, compute a magnitude squared coherence value for the received first audio signal and the received at least second audio signal in each of the plurality of frequency bins, compute a speed of variation in sound arrival direction based on the received first audio signal and the received at least second audio signal in each of the plurality of frequency bins; or combine the received first audio signal and the received at least second audio signal in each of the plurality of frequency bins, and computing a relation between an intensity of sound to an energy density of sound for each of the plurality of frequency bins.

19. The apparatus according to claim 11, wherein the at least one memory and the computer program code configured to, with the at least one processor, cause the apparatus to process the first audio signal and the at least second audio signal to obtain exclusively the monophonic audio signal.

20. The apparatus according to claim 11, wherein the apparatus is:

configured to at least one of: support a telephony application, wherein at least one of the first microphone and the at least second microphone is provided for use with the telephony application; or capture audio signals in conjunction with video signals; and wherein the apparatus is at least one of:

a mobile device, a mobile computing device, a mobile phone, a smartphone, a tablet computer or a video camera.

* * * * *